United States Patent [19]
Hoover

[11] 4,334,324
[45] Jun. 8, 1982

[54] COMPLEMENTARY SYMMETRY FET FREQUENCY CONVERTER CIRCUITS

[75] Inventor: Merle V. Hoover, Flemington, N.J.

[73] Assignee: RCA Corporation, New York, N.Y.

[21] Appl. No.: 202,668

[22] Filed: Oct. 31, 1980

[51] Int. Cl.$^3$ .............................................. H04B 1/28
[52] U.S. Cl. .................................. 455/333; 455/332; 307/304; 363/163
[58] Field of Search ............... 455/333, 318, 323, 324, 455/326, 331, 332; 307/279, 288, 304, 529, 313; 363/163, 159

[56] References Cited

U.S. PATENT DOCUMENTS

| | | | |
|---|---|---|---|
| 2,851,594 | 9/1958 | Herold | 455/333 |
| 2,932,735 | 4/1960 | Herold | 455/333 |
| 3,727,078 | 4/1973 | Wollesen | 307/529 |
| 4,032,851 | 6/1977 | Hoover | 455/332 |
| 4,090,139 | 5/1978 | Hoover | 455/333 |

OTHER PUBLICATIONS

Solid-State Devices Manual, Published by RCA Solid State Division, p. 373, Mar. 1975.

*Primary Examiner*—Tommy P. Chin
*Attorney, Agent, or Firm*—E. M. Whitacre; P. J. Rasmussen; P. M. Emanuel

[57] ABSTRACT

A frequency converter uses first and second complementary symmetry FET's to perform respective oscillator and mixer functions. The first and second FET's are arranged with respective conduction channels connected in series. The oscillator function is performed by the first FET via feedback provided between its source or drain electrode to its gate electrode. The mixer function is provided by the second FET via an input circuit coupling an input signal to its gate electrode. Sum and difference beat frequencies are available at the circuit node interconnecting the conduction channels of the first and second FET's.

12 Claims, 5 Drawing Figures

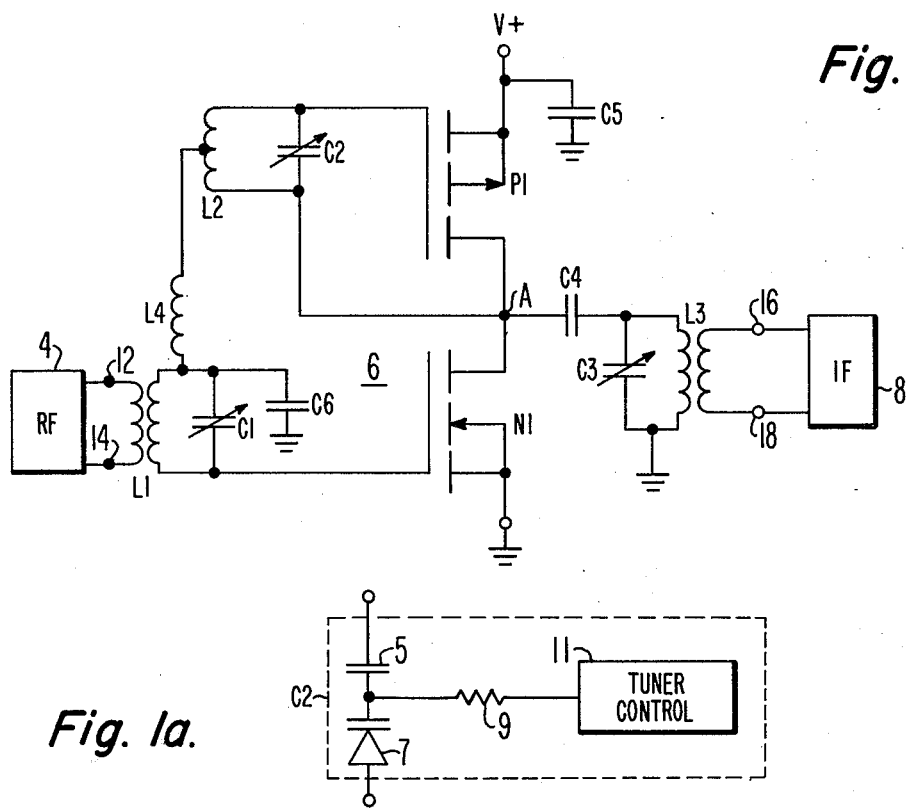
Fig. 1.
Fig. 1a.
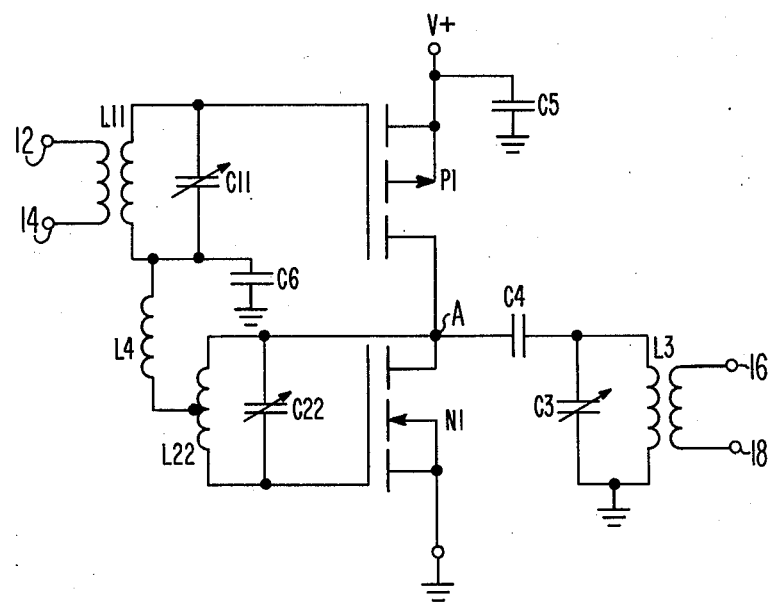
Fig. 2.

4,334,324

COMPLEMENTARY SYMMETRY FET FREQUENCY CONVERTER CIRCUITS

FIELD OF THE INVENTION

This invention relates to frequency converter circuits using field-effect transistors (FET's) as may be used, for example, in superheterodyne signal receiving systems.

BACKGROUND OF THE INVENTION

A frequency converter translates the frequency components of an input signal in the frequency domain so as to translate the input signal from one part of the frequency spectrum to another. In superheterodyne radio and television receivers, a frequency converter is used to change the frequency of the received radio frequency (RF) signal to a fixed intermediate frequency (IF) signal.

A frequency converter comprises an oscillator and a mixer. Typically, the mixer includes a non-linear device such as a diode or a transistor. The oscillator signal and the incoming RF signal are applied as inputs to the mixer. The two input signals beat (or heterodyne) within the mixer to produce a signal which, in addition to having signal components at the frequency of the input signals, has numerous sum and difference frequencies.

The output circuit of the mixer is provided with a tuned circuit for selecting only one beat frequency, i.e., the predetermined IF frequency. By tuning the local oscillator frequency, the output frequency of the mixer is kept constant for all values of received signal frequency.

It is known to use a dual gate FET transistor as a mixer. For example, see Solid State Devices Manual, SC-16, 1975, published by RCA Corporation, Solid State Division. The mixer circuit shown in FIG. 455, page 373 of the above-referenced manual employs a dual gate FET transistor wherein the RF input signal is applied to one gate and the oscillator signal is applied to the other gate. In a similar manner, two individual FET transistors of the same conductivity type with their conduction channels connected in series, may be employed as a mixer. However, such circuit configurations require a substantial number of peripheral components, particulary resistors, for proper operation.

Mixer circuits using complementary symmetry FET transistors have been disclosed in U.S. Pat. Nos. 4,032,851 and 4,090,139, both of which are issued to the present inventor and assigned to RCA Corporation. The mixer circuits shown in the above-referenced patents are of the type in which a separate oscillator would have to be employed. In contrast, circuits of the present invention are embodied in frequency converter circuits, i.e., mixer circuits of the self-oscillating type (also known as an autodyne frequency converter) wherein a separate oscillator is not required.

SUMMARY OF THE INVENTION

Frequency converters of the present invention comprise first and second FET transistors of opposite conductivity type to perform respective oscillator and mixer functions. The conduction channel of the first FET transistor is connected in series with the conduction channel of the second FET transistor. The first FET transistor is arranged as an oscillator by providing feedback from one of its drain and source electrodes to the gate electrode thereof. The second FET transistor is arranged as a mixer by coupling an input signal to the gate electrode thereof. Sum and difference beat frequencies are available at a circuit node at the interconnection of the conduction channels of the first and second FET transistors.

BRIEF DESCRIPTION OF THE DRAWINGS

FIGS. 1, 2, 3 and 4 are schematic diagrams each illustrating a frequency converter embodying the present invention.

FIG. 1a illustrates a varactor diode tuning circuit for adjusting the frequency of the tuned circuits shown in FIG. 1.

DETAILED DESCRIPTION

Figure 3:
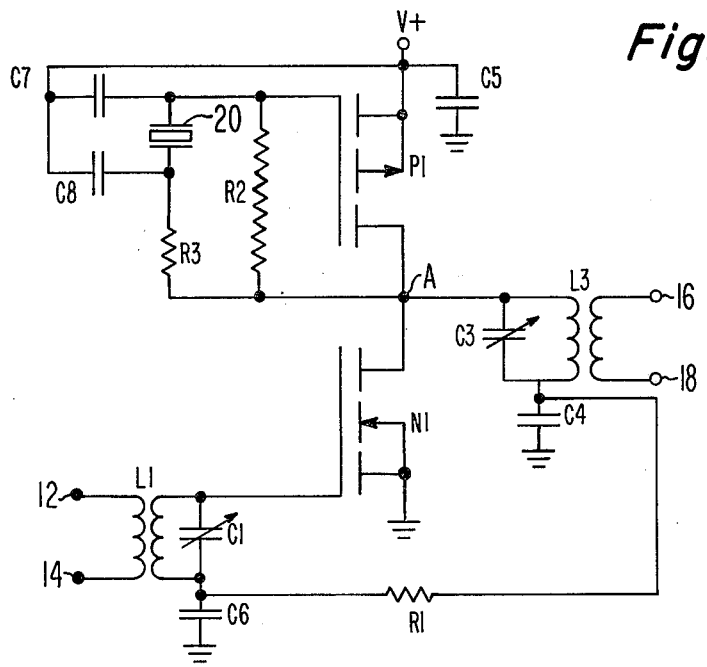

In FIG. 1, a frequency converter 6 is used as part of a superheterodyne receiving system. The frequency converter 6 receives an RF input signal from signal source 4 at terminals 12 and 14 and translates the RF signal frequency to an IF signal frequency. The output of frequency converter 6 at terminals 16 and 18 is connected to an IF amplifier stage 8.

The frequency converter 6 comprises P-channel FET transistor P1 and N-channel FET transistor N1 having respective complementary conductivity characteristics, capacitors C1, C2, C3, C4, C5 and C6, transformers L1 and L3 and inductors L2 and L4. The respective source-to-drain conduction channels of transistors P1 and N1 are connected in series across an operating potential. Particularly, the source electrode of transistor P1 is connected to a relatively positive operating potential V+, while the source electrode of transistor N1 is connected to a relatively negative potential, in this case shown as ground potential. The respective drain electrodes of transistors P1 and N1 are connected to circuit node A.

Capacitor C1 and the secondary winding of transformer L1 form a first parallel-resonant circuit at a frequency $f_1$ connected between the gate electrode of transistor N1 and ground potential through capacitor C6. Capacitor C6 is a bypass capacitor forming a low impedance path to ground potential in the range of input frequencies of interest. Capacitor C2 and inductor L2 form a second parallel-resonant circuit at a frequency $f_2$ connected between node A and the gate electrode of transistor P1. Capacitor C3 and the primary winding of inductor L3 form a third parallel-resonant circuit connected between ground potential and circuit node A via capacitor C4. Coupling capacitor C4 isolates circuit node A from ground with respect to dc, but provides a low impedance path for AC signal components in the range of output IF signal frequencies of interest. Capacitors C1, C2 and C3 are shown as variable capacitors. Generally, capacitor C3 is adjusted to correspond to a fixed IF frequency, while C1 and C2 are varied according to the desired frequency of the received RF input signal.

Quiescent operating potentials are established for transistors P1 and N1 by direct coupled feedback paths from point A to the respective gate electrodes thereof. Specifically, point A is dc connected through inductor L2 to the gate electrode of P1. Point A is also dc connected via a portion of inductor L2, and inductors L4 and L1 to the gate electrode of N1. Inductor L4 is a radio frequency choke to reduce interaction between the input circuit L1, C1 and the oscillator circuit L2, C2. The gate electrode of transistors N1 and P1 are therefore biased with similar gate-to-source dc potentials for common-source operation. Assuming that transistors P1 and N1 have complementary conductivity characteristics, node A is at a dc potential equal to V+/2 under quiescent operating conditions.

In operation, the second parallel-resonant circuit C2, L2, provides a drain-to-gate feedback path so as to form an oscillator in conjunction with transistor P1. The frequency of oscillation, $f_2$, is determined by the parallel-resonant circuit components, C2, L2, at which frequency the drain-to-gate feedback provides 180° phase shift. The current flowing through the conduction channel of transistor P1 is therefore modulated at frequency $f_2$ causing a corresponding modulation of the potential at node A.

At the same time, an RF signal input at terminals 12 and 14 of the primary winding of transformer L1 appears across the first parallel-resonant circuit formed by capacitor C1 and the secondary winding of transformer L1. Capacitor C1 and the secondary winding of transformer L1 are tuned to the input frequency, $f_1$. Since the voltage across C1 and L1 appears across the gate-to-source electrode of transistor N1 (due to bypass capacitor C6), the current flowing through the conduction channel of transistor N1 is modulated at frequency $f_1$. This causes the potential at node A to be modulated at frequency $f_1$ via the conduction channel of transistor N1 to ground potential.

Since the conduction channels of transistors P1 and N1 are connected in series, the oscillator signal and the RF input signal beat, or heterodyne, against each other. As a result, the signal at node A includes, among other components, two sideband frequencies of interest, namely $f_1$ plus $f_2$, and $f_1$ minus $f_2$. The desired IF output signal is selected by the third parallel-resonant tuned circuit comprising capacitor C3 and the primary winding of transformer L3. The secondary winding of transformer L3 provides the output signal at terminals 16 and 18 to the successive IF stage 8.

Also, the value of the bypass capacitor C5 is chosen so that C5 presents a low impedance path to the input and oscillator signals at frequencies $f_1$ and $f_2$ and the IF signal frequency of interest.

Note that no resistors are required for the operation or the quiescent biasing of the circuit of FIG. 1. Furthermore, since transistor P1 acts as an oscillator, no separate oscillator is required. The use of FET transistors, as compared to bipolar transistors, provides several advantages. Complementary FET transistors are readily integrated on a common substrate. FET transistors also provide high input impedance, square law operating characteristics, and the capability of operating over a wide dynamic range of input signal voltages.

Various substitutions may be made for the tuned circuit elements in the circuit shown in FIG. 1. For example, the parallel resonant output circuit C3, L3, which is tuned to the IF signal frequency may be a series-resonant tuned circuit or a Pi network.

The variable capacitors C1, C2 which determine the respective input signal frequency and oscillator signal frequency may be implemented with varactor diodes. A circuit employing a varactor diode which may be used as a substitution for capacitor C2 is shown in FIG. 1a. The varactor diode 7 is connected in series with a fixed capacitor 5. A tuning control 11 is connected via a large range value resistor 9 so as to provide reverse-bias dc voltage across the varactor diode 7. The value of the reverse-bias dc voltage across the varactor diode 7 determines the value of the varactor diode capacitance and therefore determines the frequency of the oscillator signal $f_2$. Varactor circuits similar to that shown in FIG. 1a can replace any of the variable capacitors shown in FIGS. 1, 2, 3, or 4.

FIG. 2 shows an alternate embodiment of the present invention. In FIG. 2, as compared to FIG. 1, the operational functions of transistors P1 and N1 are reversed. That is, transistor N1 and its associated parallel-resonant tuned circuit C22, L22 form the oscillator, whereas transistor P1 and its associated parallel-resonant tuned circuit C11, L11 form the input signal amplifier and mixer.

FIG. 3 shows another embodiment of the present invention employing a crystal controlled oscillator to improve oscillator frequency stability. A Pi-type network comprising capacitors C7 and C8, crystal 20, and resistor R3 provides the requisite drain-to-gate feedback for transistor P1 necessary for oscillation. Input signal amplification and the mixing functions are performed by transistor N1.

The frequency converter of FIG. 3 provides a fixed oscillator frequency for conveniently tuning a receiver to a predetermined frequency. Such circuits are also useful in broadband frequency converters for translating a band frequencies across the frequency spectrum.

A quiescient operating point is established through resistors R1 and R2 which provide respective dc connections between the drain and gate electrodes of transistors P1 and N1. Specifically, node A is connected to the gate electrode of transistor P1 via resistor R2. Node A is also connected to the gate electrode of transistor N1 via the primary winding of transformer L3, resistor R1, and the secondary winding of transformer L1. Capacitor C4 serves to block a dc path from node A to ground, while providing a low impedance path to ground for AC signal components selected by the IF tuned circuit C3, L3 at the output IF frequency of interest.

Figure 4:
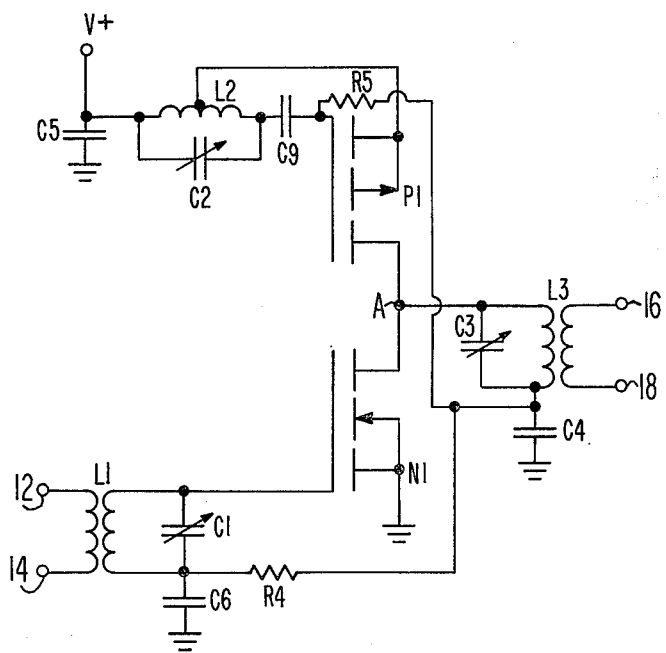

Yet another embodiment of a frequency converter in accordance with the present invention is shown in FIG. 4.

Inductor L2 and capacitor C2 form a parallel-resonant circuit connected at one terminal thereof to the positive operating potential V+. Coupling capacitor C9 connects the other terminal of the parallel-resonant circuit L3,C2 to the gate electrode of transistor P1. The source electrode of transistor P1 is connected to a top point on inductor L2.

Quiescent bias is established via resistors R4 and R5. Node A is dc connected to the gate electrode of transistor P1 via the primary winding of transformer L3 and resistor R5. Node A is also dc connected to the gate electrode of transistor N1 via the primary winding of transformer L3, resistor R4, and the secondary winding of transformer L1.

In operation, the source current of transistor P1 flows through a portion of the inductor L2. Such arrangement provides feedback between the channel current of transistor P1 and the gate electrode thereof through capacitor C9. Oscillations are thus sustained at a frequency determined by the parallel-resonant tuned circuit L2, C2. As before, the voltage at node A is simultaneously modulated at the frequency of the oscillator (by transistor P1) and the frequency of the input signal (by transistor N1). The desired IF output signal frequency is selected by the parallel-resonant tuned circuit comprising capacitor C3 and the primary winding of transformer L3.

Note that the conduction channel of transistor P1 is connected between the oscillator parallel-resonant circuit L2, C2 and the output IF resonant circuit L3, C3. Compare the circuit of FIG. 1 wherein the oscillator parallel-resonant circuit L2, C2 and the output IF resonant circuit L3, C3 are connected via capacitor C4. In the arrangement of FIG. 4, the separation provided by the conduction channel of transistor P1 reduces the frequency interaction between the variable frequency oscillator circuit L2, C2 and the fixed frequency IF circuit, L3, C3.

What is claimed is:

1. A frequency converter comprising:
   first and second power supply terminals for receiving an operating potential therebetween;
   first and second FET transistors of opposite conductivity type, each having respective source, gate and drain electrodes, the respective drain electrodes thereof being coupled to a circuit node;
   means for coupling the source electrode of said first FET transistor to said first power supply terminal;
   means for coupling the source electrode of said second FET transistor to said second power supply terminal;
   feedback means connected between the gate electrode of said first FET transistor and one of said source and drain electrodes of said first FET transistor for conditioning that transistor to oscillate so as to provide an oscillator signal at said circuit node;
   input means for coupling an input signal to the gate electrode of said second FET transistor; and
   tuning means coupled to said circuit node for selecting signal components corresponding to a beat frequency between the frequency of said oscillator signal and the frequency of said input signal.

2. A frequency converter according to claim 1 wherein said feedback means comprises:
   a first inductor;
   first capacitor means for providing capacitance; and
   means for connecting said first inductor and said first capacitance means in a parallel-resonant circuit between first and second terminals, said first terminal thereof being connected to the gate electrode of said first FET transistor, said second terminal thereof being connected to the drain electrode of said first FET transistor.

3. A frequency converter according to claim 2 wherein said input means comprises:
   a second inductor;
   second capacitor means for providing capacitance;
   means for connecting said second inductor and said second capacitor means in a second parallel-resonant circuit between first and second terminals, said first terminal thereof being connected to the gate electrode of said second FET transistor;
   a third capacitor, said third capacitor being connected between said second terminal of said second parallel-resonant circuit and the source electrode of said second FET transistor; and
   means for inductively coupling said input signal to said second inductor.

4. A frequency converter according to claim 3 further including a third inductor connected between said first and second inductors so as to provide a dc path between said circuit node and the gate electrode of said second FET transistor.

5. A frequency converter according to claim 4, wherein said tuning means comprises:
   a forth inductor;
   a fourth capacitor;
   means for connecting said fourth inductor and said fourth capacitor in a third parallel-resonant circuit between first and second terminals, said first terminal thereof being connected to said second power supply terminal; and
   a fifth capacitor, said fifth capacitor being connected between said second terminal of said third parallel-resonant circuit and said circuit node.

6. A frequency converter according to claim 4, wherein said tuning means comprises:
   a fourth inductor;
   a fourth capacitor;
   means for connecting said fourth capacitor and said fourth inductor in a third parallel-resonant circuit between first and second terminals, said first terminal thereof being connected to said circuit node; and
   a fifth capacitor, said fifth capacitor being connected between said second terminal of said third parallel-resonant circuit and said second power supply terminal.

7. A frequency converter according to claim 4 wherein said first capacitor means and said second capacitor means each comprise a respective varactor diode.

8. A frequency converter according to claim 1, wherein said feedback means includes a crystal connected between first and second terminals, said first terminal thereof being connected to the gate electrode of said first FET transistor, said second terminal thereof being connected to the drain electrode of said first FET transistor.

9. A frequency converter according to claim 1 wherein said means for coupling the source electrode of said first FET transistor to said first power supply terminal and said feedback means together comprise:
   a first inductor having two ends and a tap point;
   first capacitor means for providing capacitance;
   means for connecting said first inductor and said first capacitor means in a parallel-resonant circuit between first and second terminals, said first terminal thereof being connected to said first power supply terminal;
   a second capacitor connected between said second terminal of said parallel-resonant circuit and the gate electrode of said first FET transistor; and
   a direct connection between said tap point of said first inductor and the source electrode of said first FET transistor.

10. A frequency converter according to claim 9 wherein said input means comprises:
    a second inductor;
    third capacitor means for providing capacitance;
    means for connecting said second inductor and said third capacitance means in a second parallel-resonant circuit between first and second terminals, said first terminal thereof being connected to the gate electrode of said second FET transistor;
    a fourth capacitor, said fourth capacitor being connected between said second terminal of said second parallel-resonant circuit and said second power supply terminal;

means for inductively coupling said input signal to said second inductor.

11. A frequency converter according to claim 10 wherein said tuning means comprises:
   a third inductor;
   a fifth capacitor;
   means for connecting said third inductor and said fifth capacitor in a third parallel-resonant circuit between first and second terminals, said first terminal thereof being connected to said circuit node; and
   a sixth capacitor, said sixth capacitor being connected between said second terminal of said third parallel-resonant circuit and said second power supply terminal.

12. A frequency converter according to claim 10 wherein said first capacitor means and said third capacitor means each comprise a varactor diode.

* * * * *